United States Patent [19]

Rajeevakumar

[11] Patent Number: 5,692,281
[45] Date of Patent: Dec. 2, 1997

[54] METHOD FOR MAKING A DUAL TRENCH CAPACITOR STRUCTURE

[75] Inventor: Thekkemadathil Velayudhan Rajeevakumar, Scarsdale, N.Y.

[73] Assignee: International Business Machines Corporation, Armonk, N.Y.

[21] Appl. No.: 614,768

[22] Filed: Jan. 16, 1996

Related U.S. Application Data

[60] Provisional application No. 60/005,624 Oct. 19, 1995.

[51] Int. Cl.$^6$ .............................. H01G 7/00; H01L 21/465
[52] U.S. Cl. .............................. 29/25.42; 437/51; 437/60; 437/228; 437/919; 361/321.4
[58] Field of Search .................. 437/47, 51, 60, 437/228, 919; 29/25.42; 257/301–305; 361/321.1, 321.2, 321.3, 321.4, 321.5

[56] References Cited

U.S. PATENT DOCUMENTS

| | | |
|---|---|---|
| 4,397,075 | 8/1983 | Futula, Jr. et al. . |
| 4,649,625 | 3/1987 | Lu . |
| 4,853,348 | 8/1989 | Tsubouchi et al. ............ 437/203 |
| 5,079,615 | 1/1992 | Yamazaki et al. . |
| 5,176,789 | 1/1993 | Yamazaki et al. ............ 156/643 |
| 5,336,912 | 8/1994 | Ohtsuki ............................ 257/304 |
| 5,449,630 | 9/1995 | Lur et al. ......................... 437/47 |

FOREIGN PATENT DOCUMENTS

| | | | |
|---|---|---|---|
| 60-176265 (A) | 9/1985 | Japan . | |
| 60-245161 (A) | 12/1985 | Japan . | |
| 62-40759 (A) | 2/1987 | Japan | H01L 27/10 |
| 63-299371 (A) | 12/1988 | Japan | H01L 27/04 |
| 1-65862 (A) | 3/1989 | Japan | G01L 27/04 |
| 4-287366 (A) | 10/1992 | Japan . | |

OTHER PUBLICATIONS

N.C.C. Lu et al IEDM 1988 IEEE pp. 588–591 "A Buried Trench DRAM Cell Using a Self–Aligned Epitaxy Over Trench Technology".

L. Nesbit et al IEDM 1993 IEEE pp. 627–630 "A 0.6 µm$^2$ 256 Mb Trench DRAM Cell with Self–Aligned BuriEd STrap (BEST)".

*Primary Examiner*—Bot L. Ledynh
*Attorney, Agent, or Firm*—Robert P. Tassinari, Jr.

[57] ABSTRACT

A dual trench structure for a high density trench DRAM. The dual trench structure, each of which can reside in part under the access device of a respective cell, does not require the use of expensive selective epi growth techniques. A sub-minimum lithographic trench opening can be used (1) to improve the cell area, (2) to increase the device length, and (3) to improve the margin of diffusion straps. Acceptable trench capacitance for the cells formed in a single opening can be achieved either by using thin capacitor dielectric, or by expanding the trenches laterally under the devices.

15 Claims, 8 Drawing Sheets

METHOD FOR MAKING A DUAL TRENCH CAPACITOR STRUCTURE

CROSS-REFERENCE TO RELATED APPLICATIONS

The present application claims priority to co-pending U.S. provisional application 60/005.624 filed Oct. 19, 1995.

FIELD OF THE INVENTION

The invention relates to DRAM cells, and in particular to a trench capacitor for use with such cells.

BACKGROUND AND SUMMARY OF THE INVENTION

As the DRAM cell is scaled towards the 256 Mb DRAM and beyond, innovative cell concepts are needed to push the cell area to practical limits. One such concept is to reduce the cell area by forming two trenches using the trench opening for one. This technique can be used to reduce the cell area of folded bitline cells to six or four lithographic squares (using two levels of wiring to form bitlines), and to reduce the cell area of open bitline cells to two lithographic squares. Although cell structures using such concepts as a buried trench cell have been proposed in the past, these structures rely on expensive selective epi growth techniques to reduce the trench opening. Selective epi growth, however, typically has a very high defect density and therefore is generally considered to be unsuitable for DRAM applications.

Thus, a need has arisen for a DRAM cell structure that can take advantage of the area minimization benefits of prior art trench-under-access device techniques, while avoiding the drawbacks associated with selective epi growth.

It is an object of the present invention to provide a capacitor for a DRAM cell having a smaller cell area than prior cells, but without the adverse effects of selective epi growth.

It is a further object to provide a method for fabricating such a cell.

It is a further object of the invention to provide a method for fabricating a plurality of trench capacitors, using a single opening, for use in a reduced-area DRAM cell, the method using reactive ion etching and oxidation techniques to fabricate storage trenches at least partially under their respective cells' access device.

It is a further object of the invention to provide a trench capacitor for use in DRAM cells that has two storage trenches formed from a single trench opening.

The foregoing objectives are achieved by the present invention, which is a method, comprising: providing a substrate; forming a trench in the substrate, the trench having an opening of a first cross sectional area at the surface of the substrate; expanding that portion of the trench below a predetermined depth to a cross-sectional area larger than the first cross-sectional area; forming a dielectric layer on the wall of the trench in the expanded portion of the trench; filling the expanded portion of the trench with a polysilicon material; forming a partition in the polysilicon material to separate the polysilicon in a first portion of the expanded portion of the trench from the polysilicon in a second portion of the expanded portion of the trench.

FIGURES

DETAILED DESCRIPTION

First Embodiment

Figure 1A:
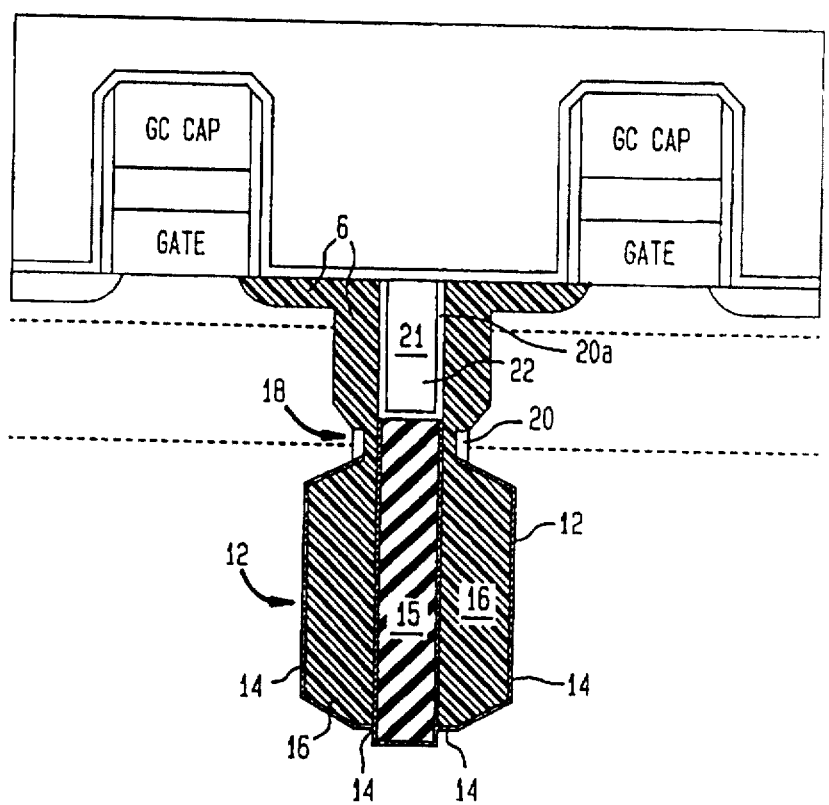
FIGS. 1a and 1b are schematic cross-sectional views of two embodiments of the present invention.

The basic cell structure of a DRAM cell employing a trench capacitor in accordance with the invention is shown in FIG. 1a. The details of the components above the line 2 are beyond the scope of this invention. An example of a DRAM structure suitable for use with the trench of the present invention can be found in L. Nesbit, et al., "A 0.6 µm² 256 Mb Trench DRAM Cell With Self-Aligned BuriEd STrap (BEST)", IEDM 93–627 , pp. 26.2.1–26.2.4, 1993, ("Nesbit") which is incorporated herein by reference. Other suitable DRAM cells can also take advantage of the benefits of the invention.

Referring to FIG. 1a, a device constructed in accordance with the invention includes a storage trench, which is lined with a dielectric material 14, and comprises a pair of trench capacitor regions 12 filled with polysilicon 16. The trench capacitor regions 12 can be constructed to extend at least partially under the access devices of a pair of DRAM cells.

The pair of trench capacitor regions are electrically isolated from one another by a pillar structure 15. The pillar structure is electrically connected to the substrate at substrate contact 17. The pillar provides additional storage capacitance to each of the trenches.

In the embodiment of the invention shown in FIG. 1a, the trench includes a neck 18 having a cross-sectional area substantially less than the cross-sectional area of the widest portion of the trench, as shown. Thus, in a preferred embodiment of the invention, the cell will have a "bottle" shape as shown in FIG. 1a. The neck 18 is lined with a nitride collar 20, another nitride layer 20a, a substrate well 22, and an oxide region 21 introduced during fabrication. The neck is surrounded by a diffusion strap 6 of the associated DRAM cells. It will be understood that the cells of the present invention can be used with equal effect in DRAMs employing a surface strap to connect the storage nodes with the access devices.

The trench surface opening formed by the upper portion of neck 18 can be of minimum lithography dimensions, such as shown in the preferred embodiment of FIG. 1a, or, in another preferred embodiment of the invention (not shown), of sub-minimum lithography dimensions. The latter can be achieved using spacer techniques known to those skilled in the art. More specifically, oxide spacers can be employed to reduce the cross-sectional area of a photolithographic square prior to trench etching. The benefits of using a sub-minimum lithographic trench opening are: (1) decreased cell area; (2) increased device length (reducing the size of the trench opening allows room for a larger access device for a cell of a given size, which reduces the likelihood of effects such as punch-through and shorts); and (3) improved tolerance margins for a diffusion strap (that is, the size-tolerance margins for producing a sub-surface diffusion strap are greater as the distance between the access device and the trench increases, which makes the step of forming the diffusion strap simpler).

The lateral extension of each trench capacitor region 12 under a device is adjusted as per the capacitance requirements of the cell, with the capacitance of each cell being proportional to the surface area of that trench.

A preferred method for fabricating the dual trench structure of the invention shown in FIG. 1a is now described with reference to FIGS. 2a–11b.

Figure 2A:
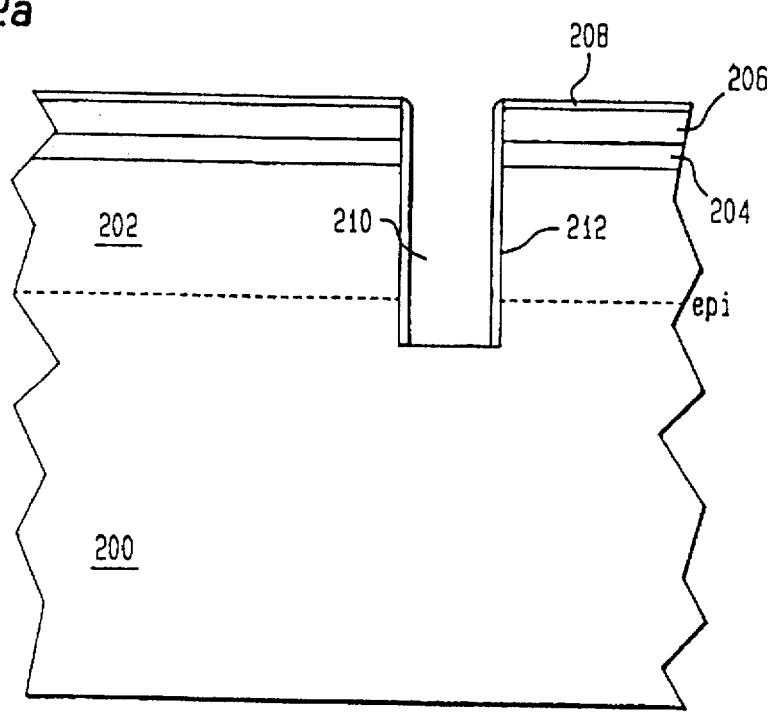
FIGS. 2a–11b show cross-sectional schematic views of the cell of FIGS. 1a and 1b at various stages in the fabrication thereof.

Referring to FIG. 2a, a doped silicon substrate 200 with a lightly doped epitaxial layer 202 of silicon is provided. Next, thin layers of nitride 204, oxide 206 and nitride 208, respectively, are blanketly deposited on the epitaxial layer 202 of the substrate to form a protective layer for subsequent etching steps. Next, a trench 210 is etched to about 0.5 µm to 0.6 µm into the substrate as follows. First, a patterned portion of layers 204, 206 and 208 are etched using photoresist and reactive ion etching (RIE). Then, using the remaining portions of layers 204, 206 and 208 as a mask, trench 210 is etched using RIE to a depth below that of the n-well (or p-well) depth of the memory array (not shown). The well depth typically is about 1.5 µm. Nitride collar 212 is now formed around the neck of the trench in the position shown in FIG. 2a by blanketly depositing a layer of nitride on the structure, and then anisotropically etching by RIE to remove this nitride layer from horizontal surfaces. If desired, as discussed previously, a sub-minimum lithographic trench may be initially etched by applying spacers to the oxide mask.

Figure 2B:
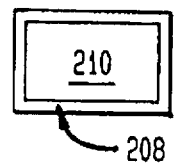

FIG. 2b shows a top-view (layout) of the structure shown in FIG. 2a. In particular, what is shown in FIG. 2b is a mask, denoted Trench1. The Trench1 mask masks all but the nitride collar 212 and trench 210 during strap fabrication. In the method of this embodiment, two trench masks, labelled Trench1 and Trench2 will be used. Trench1 mask will be used as a strap mask and Trench2 mask will be used to form an isolation pillar between two storage trenches, each to be described in more detail below.

Figure 3:
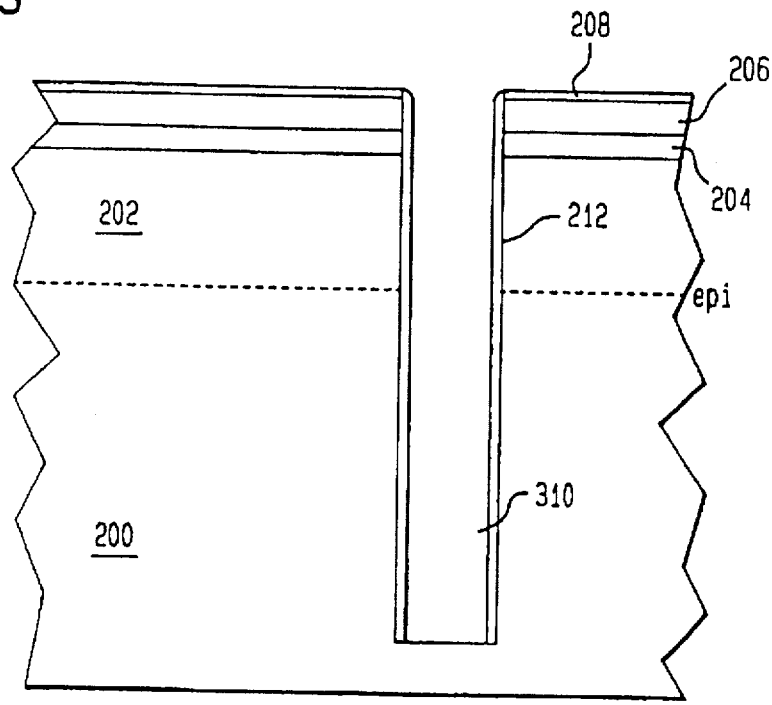

Next, referring to FIG. 3, The trench is further etched to its full depth, using RIE. Nitride 208, oxide 206 and nitride 204 provide a mask for this etching operation. In FIG. 3, the deepened trench is labelled 310.

Figure 4:
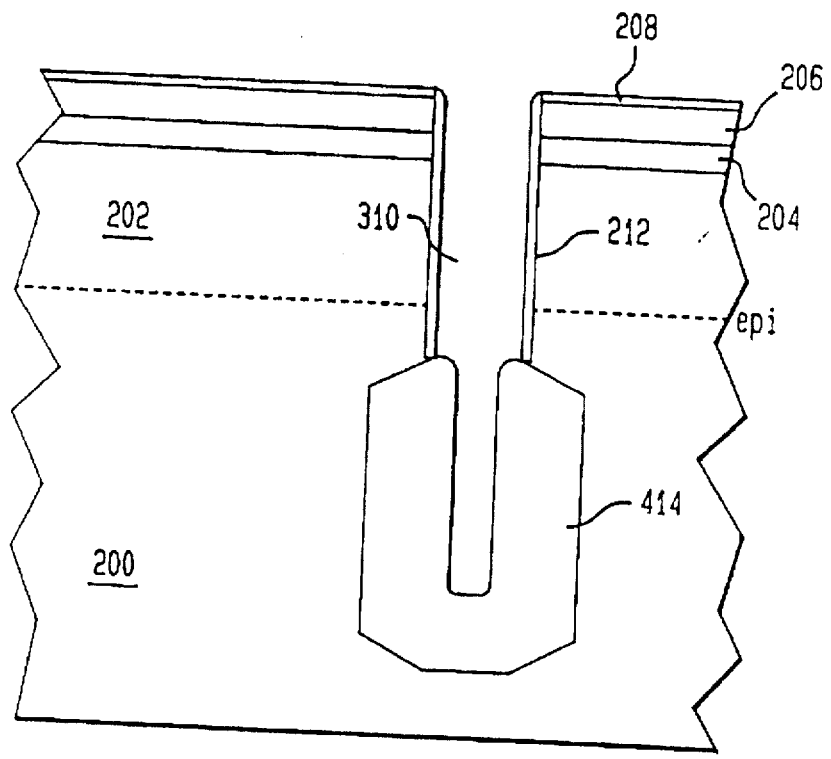

The trench 310 is now oxidized by thermal oxidation, resulting in the formation of oxide layer 414 on the walls of trench 310, as shown in FIG. 4. It can be seen that the normal oxidation will result in an expansion of the material in the trench below the epi region. The trench within the epi region 202 is protected from oxidation by the nitride collar 212. The distance of the expansion and lateral extension of the oxide layer 414 is proportional to the oxidation time. The lateral extension of the oxide layer, in turn, determines the lateral expansion of the resultant trenches under the access devices.

Figure 5:
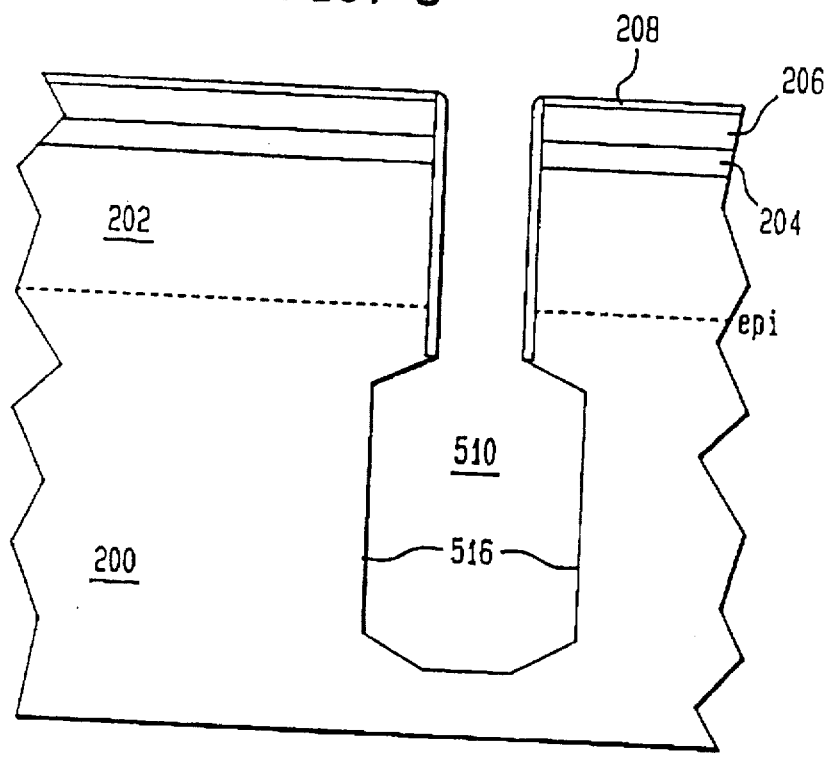

The oxide layer 414 is now isotopically etched using a buffered HF etch to obtain a bottle-shaped trench. This process of oxidation of the trench followed by etching may require more than one iteration to achieve the desired final trench size. The resulting structure, with the expanded trench now labelled 510, is shown in FIG. 5. Note also that the nitride collar may be substantially or even completely etched away during this process, so the actual structure may or may not have the nitride collar shown in FIG. 5.

Figure 6A:
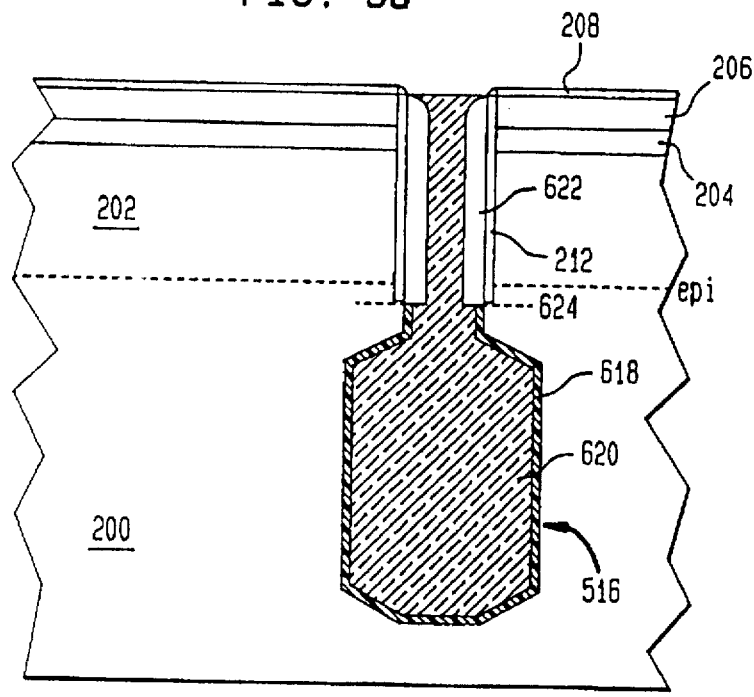

Referring to FIG. 6a, capacitor dielectric 618 is now formed on the walls 516 of the trench. The dielectric preferably is a thin oxide-nitride-oxide composite, formed by performing a thin oxidation of the trench surface 516, followed by low pressure, isotropic deposition of a thin layer of nitride on the oxide layer, followed by thermal oxidation of the nitride layer.

Figure 6B:
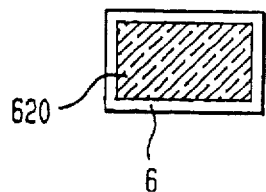

Next, the trench is filled with polysilicon fill 620. This is achieved by in situ doped polysilicon deposition. To prevent closure of the neck of the trench prior to filling the trench, a deposition and anisotropic etch back process may be used to fill the bottle shaped trench while avoiding the introduction of voids. The polysilicon formed on the surface of the structure is then planarized and recessed to a depth 624. Next, the entire structure is oxidized or an oxide layer is deposited and anisotropically etched to form insulating oxide collar 622. Finally, polysilicon is again blanketly deposited on the structure to fill the remainder of the trench (i.e., the void in the neck region), and planarized to yield the structure shown in FIG. 6a. A top view is shown in FIG. 6b.

Figure 7A:
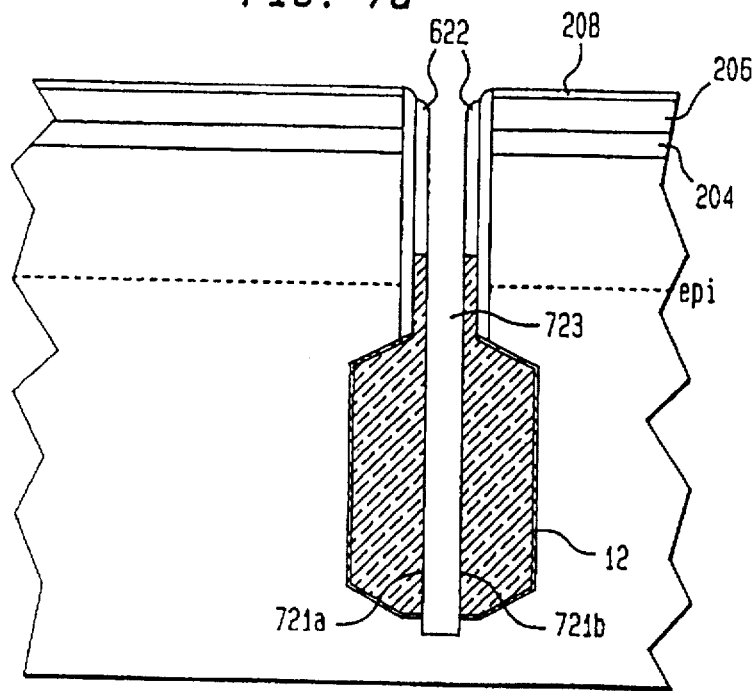
Figure 7B:
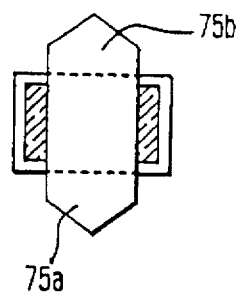

Referring now to FIG. 7a, using the mask denoted TRENCH2, a top view of which is shown in FIG. 7b, the polysilicon in the neck and trench is etched through the middle using RIE. As shown in FIG. 7a, this etching step forms two storage trenches 12 in the bottle shaped trench, one trench being located on each side of a pillar-shaped channel or opening 723 defined by walls 721a and 721b (and extending in the direction in and out of the page). This is a two step etch. The first step is to etch through the nitride-oxide-nitride layer (208-206-204) in regions 75a and 75b of FIG. 7b. This etch is performed using hot phosphoric acid for the nitride etching and buffered HF for the oxide etching. The second step is to etch the exposed polyfill in the trench itself after the mask has been removed. This latter step is performed using RIE.

Figure 8A:
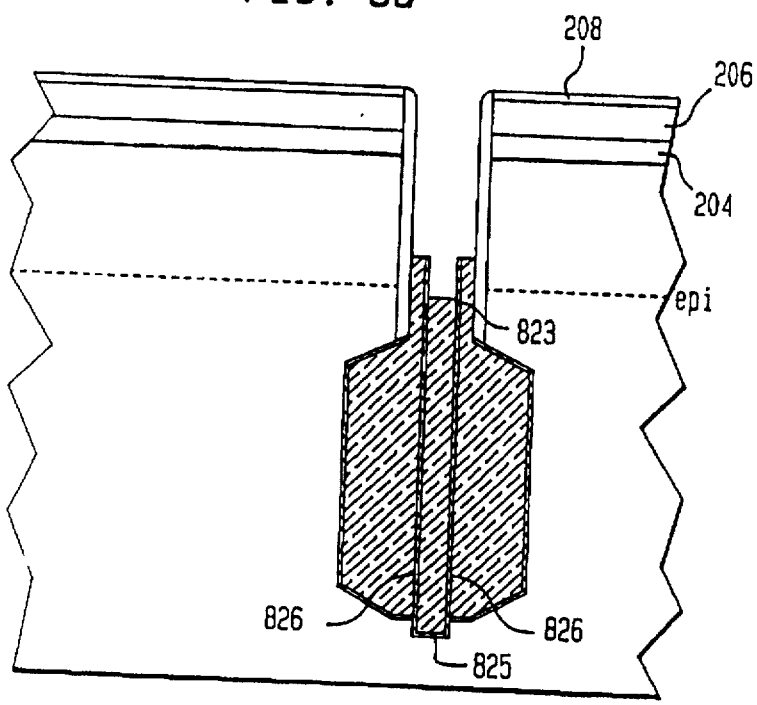

Referring to FIG. 8a, capacitor dielectric is again formed on the surfaces of the pillar shaped trench 723, thus forming dielectric layer 826. The dielectric is preferably a thin oxide-nitride-oxide composite formed by performing a thin oxidation of the walls defining the trench, followed by low pressure, isotropic deposition of a thin layer of nitride on the oxide layer, followed by thermal oxidation of the nitride layer.

Figure 8B:
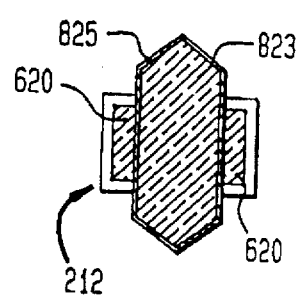

Next, the pillar-shaped opening 723 is filled with polysilicon. As a first step to accomplishing this, a layer of polysilicon is deposited to cover the bottom of the pillar-shaped opening. In order to provide a contact with the substrate, this deposited polysilicon layer is anisotropically etched through a portion of the dielectric layer 618 that lines the bottom of the trench, thus opening the bottom of the trench. Poly deposition is then continued to further fill the opening 723, forming an isolation pillar 823 connected to the substrate by means of a substrate contact region 825 produced by the direct contact between the layer of polysilicon deposited in the trench polysilicon and the doped silicon substrate 200. The polysilicon used to form the pillar is then planarized on the upper surface of the structure, the poly is recessed using RIE, and the oxide collar 622 is removed using buffered HF, resulting in the structure as shown in FIG. 8a. The corresponding top view is shown in FIG. 8b.

Figure 9A:
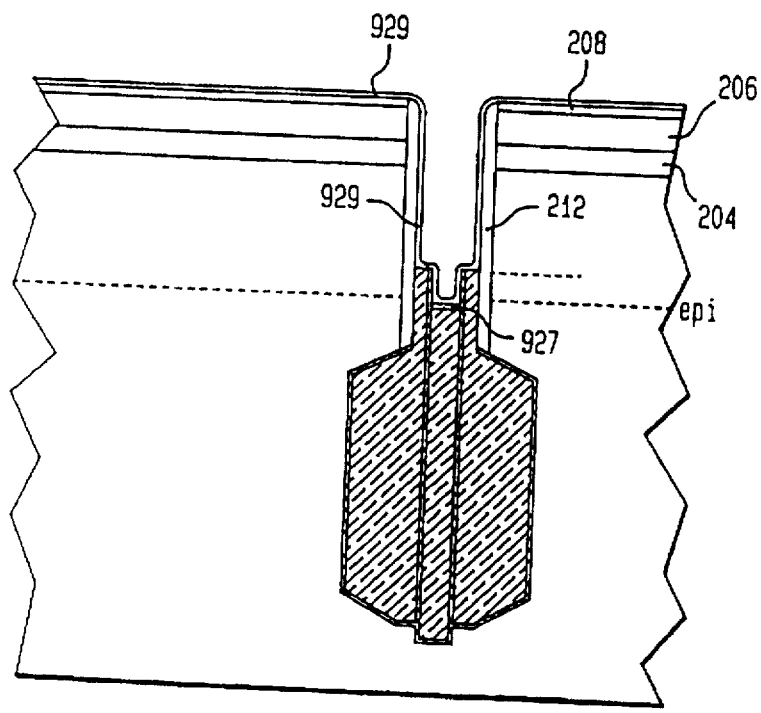
Figure 9B:
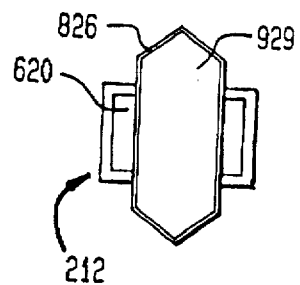

Referring now to FIG. 9a, the exposed top of the pillar is oxidized to form a cap oxide 927. A thick nitride layer 929 is then deposited as shown in FIG. 9a. The top view is shown in FIG. 9b.

Figure 10A:
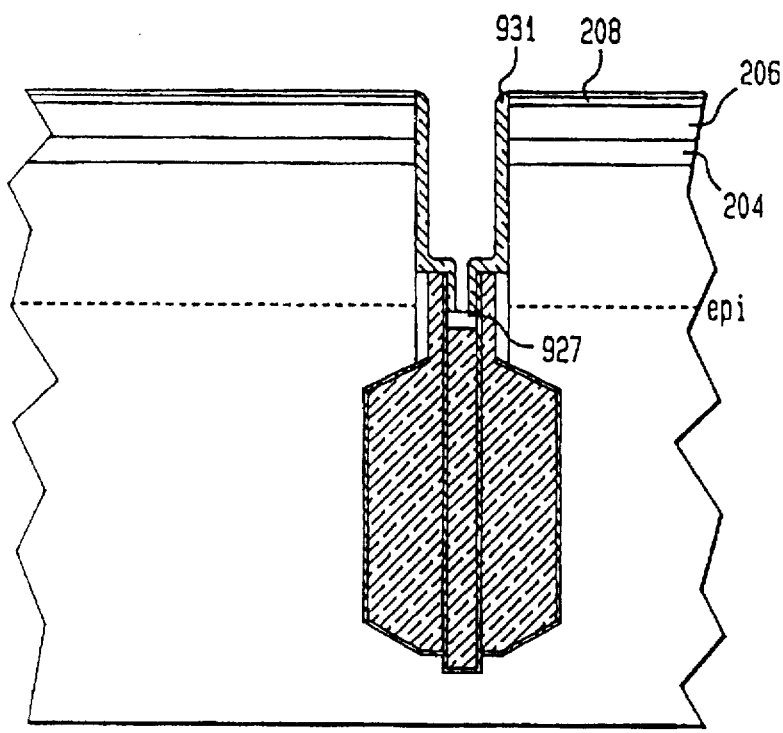
Figure 10B:
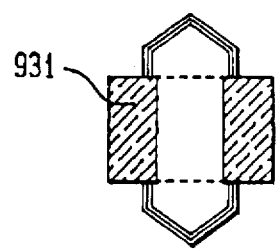

Using the TRENCH1 mask, the nitride layers 212 and 929 are removed from the lateral sides near the middle of the trench (i.e., above line 950 in FIG. 9a). A nitride layer is left on the top of the oxide cap to further protect the pillar during subsequent steps. A thick polysilicon layer 931 is then deposited in the trench. This layer 931 is formed into a collar around the trench by anisotropically etching that portion of layer 931 lying on top of the oxide cap 927. This collar, as shown in FIG. 10a, will be used as a strap. The TRENCH1 mask is again applied to remove the polysilicon layer collar outside TRENCH1, as shown in FIG. 10a. The top view (after removal of polysilicon) is shown in FIG. 10b.

Figure 11A:
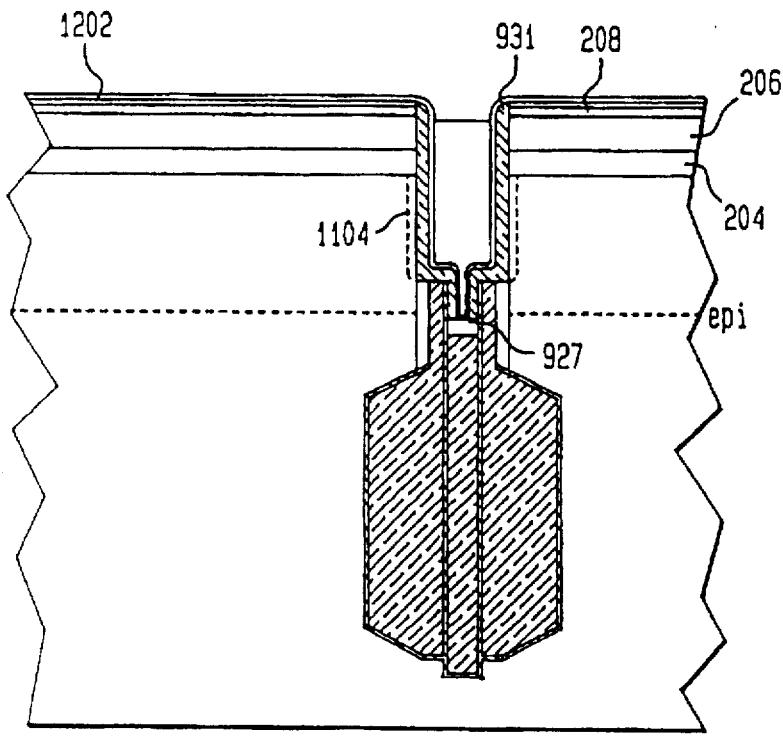
Figure 11B:
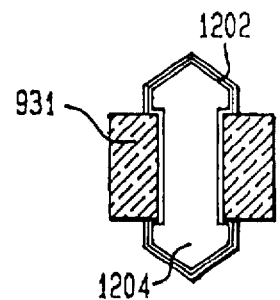

A thin nitride layer 1202 is now deposited, followed by oxide 1204 deposition to fill the neck of the trench, as shown in FIG. 11a. The top view is shown in FIG. 11b. The array well 1250 is implanted after removing the oxide 206 and nitride 204. Out-diffusion from the trench neck, accomplished by heating to an appropriate temperature, is done to form the diffusion strap 1104. Further processing is now continued using conventional processing steps (for instance as described in Nesbit) to form the structure shown in FIG. 1a.

In summary, a high density trench DRAM cell where a pair of trench capacitors are disposed at least partially under the cell has been described. Advantageously, the proposed structure does not require use of expensive selective epi growth techniques.

Second Embodiment

Figure 1B:
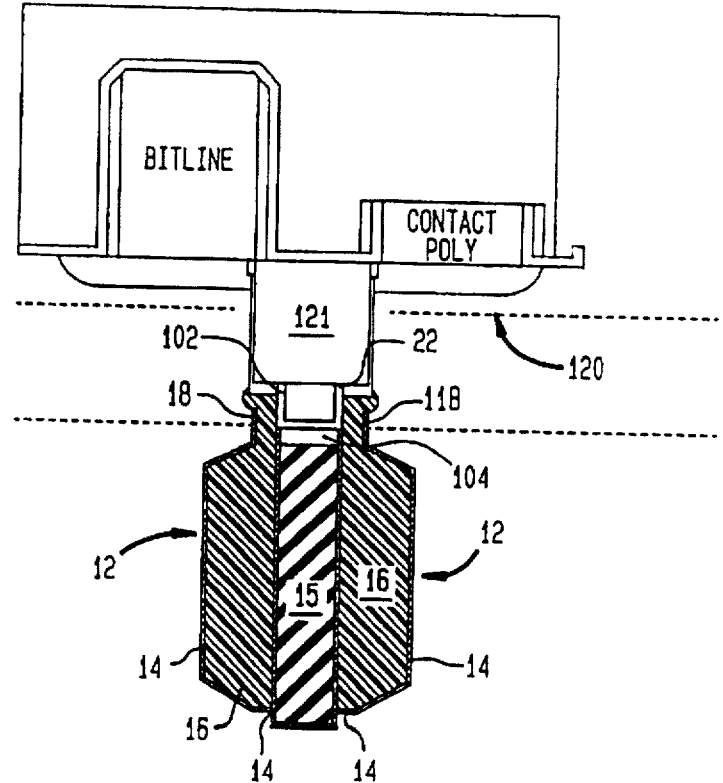

Referring to FIG. 1b, a second embodiment of a device constructed in accordance with the invention will now be described. The device of FIG. 1b includes a storage trench, which is lined with a dielectric material 14, and comprises a pair of trench capacitor regions 12 filled with polysilicon 16. The trench capacitor regions 12 can be constructed to extend at least partially under the access devices of a pair of DRAM cells.

The pair of trench capacitor regions 12 are electrically isolated from one another by a pillar structure 15. The pillar structure is electrically connected to the substrate at substrate contact 17. The pillar provides additional storage capacitance to each of the trenches.

In the embodiment of the invention shown in FIG. 1b, the trench includes a neck 18 having a cross-sectional area substantially less than the cross-sectional area of the widest portion of the trench. Thus, the cell has a "bottle" shape as shown in FIG. 1b. The neck 18 includes a nitride plug 102, separated from the pillar 15 by an oxide cap 104. A nitride collar 118 lines the neck. Diffusion areas 120 are disposed adjacent the neck. Finally, a gate poly material 121 is disposed in the trench above the plug 102. The portion of the device disposed above line 2 is beyond the scope of this invention.

The trench surface opening formed by the upper portion of neck 18 can be of minimum lithography dimensions, as shown, or of sub-minimum lithography dimensions (as discussed above with respect to the embodiment of FIG. 1a).

The process steps for forming the structure of FIG. 1b will now be described. The process steps described above with respect to FIGS. 2–10a are used to form the first and second embodiments. The steps described by FIGS. 12–14 are peculiar to the second embodiment.

Figure 12:
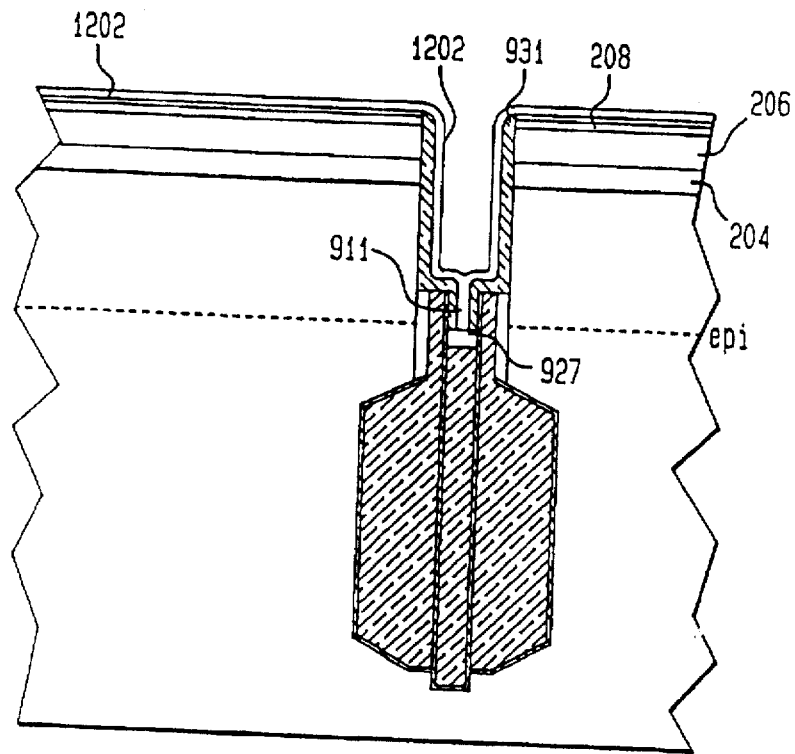
FIGS. 12–14 are further process steps used in the fabrication of the embodiment of FIG. 1b.
Figure 13:
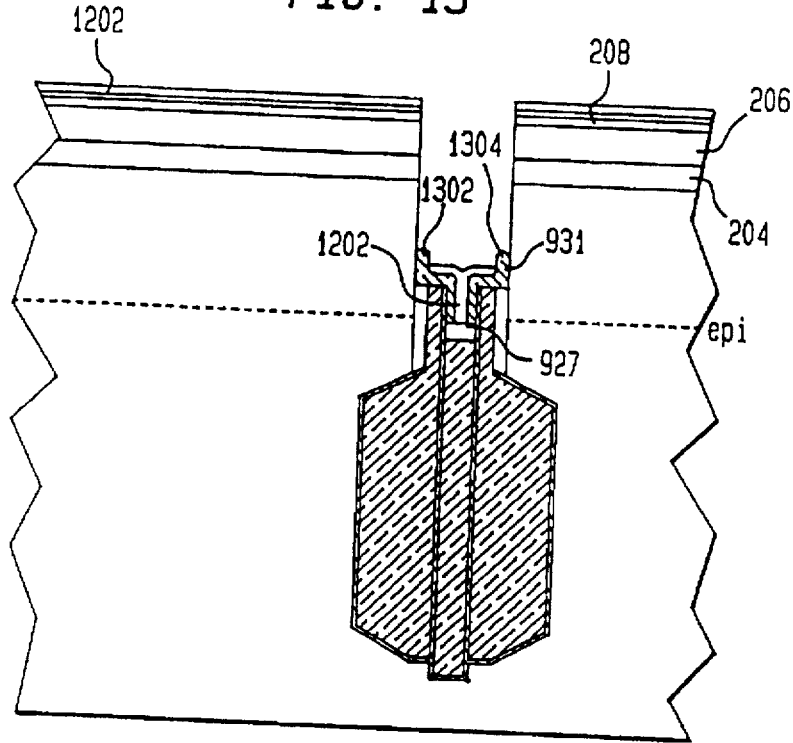

Referring to FIG. 12, a nitride layer 1202 is now deposited. The top portion of the deposited nitride 1202 and poly strap 931 are now etched, as shown in FIG. 13, exposing silicon on each side 1302, 1304 of the strap. This etch may be done first by filling the trench necks with a planarization resist, and then recessing the resist to an appropriate depth. Isotropic timed etch may then be performed on the exposed area to yield the desired structure.

Figure 14:
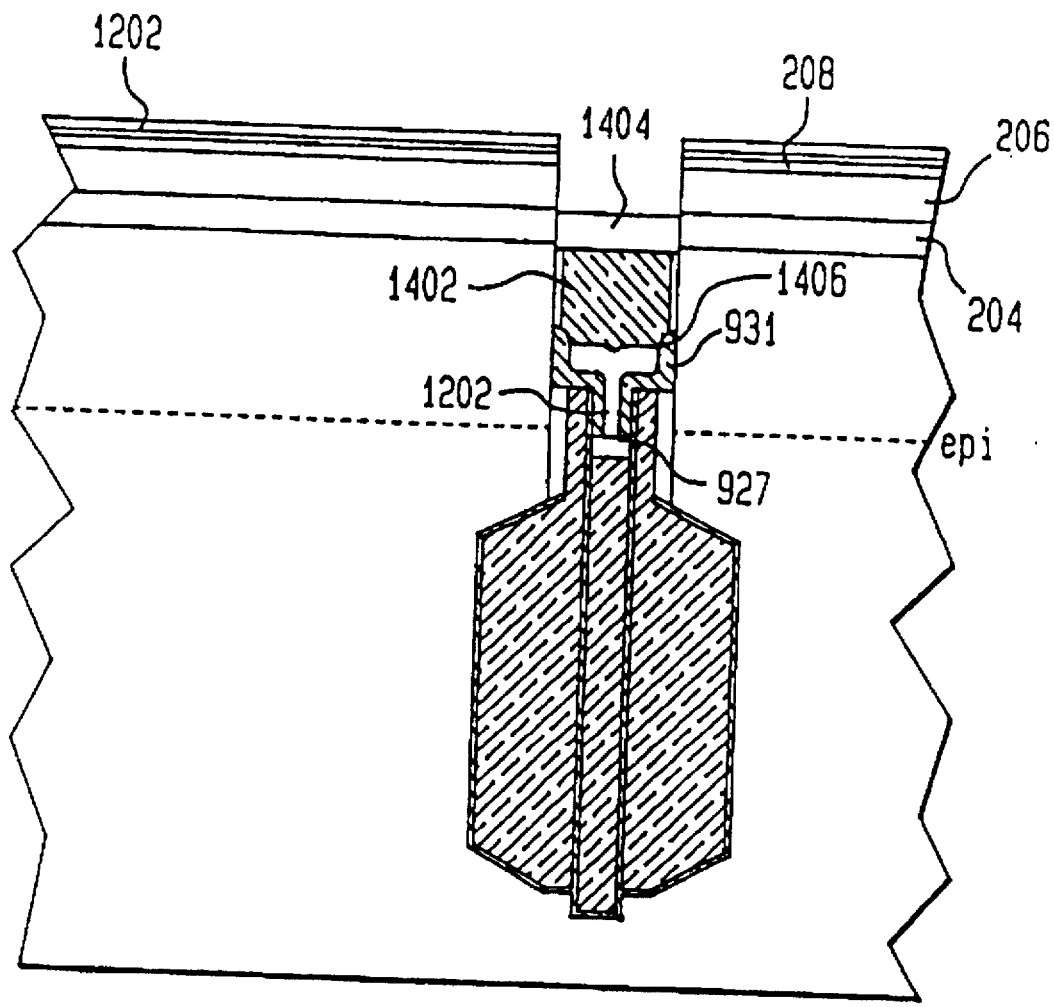

Referring next to FIG. 14, gate oxide 1406 is now formed over the exposed silicon, followed by gate poly deposition, planarization, and recess to form the gate poly 1402 structure shown in FIG. 14. The top surface of the gate poly 1402 is now oxidized to form a cap oxide 1404, as shown in FIG. 14. The processing may now be continued using conventional processing steps to fabricate the structure shown in FIG. 1b.

While the invention has been described in particular with respect to preferred embodiments thereof, it will be understood by those skilled in the art that modifications to the disclosed embodiments can be effected without departing from the spirit and scope of the invention.

I claim:

1. A method, comprising the steps of:
   providing a substrate;
   forming a trench in the substrate, the trench having an opening of a first cross sectional area at the surface of the substrate;
   expanding that portion of the trench below a predetermined depth to a cross-sectional area larger than the first cross-sectional area;
   forming a dielectric layer on the wall of the trench in the expanded portion of the trench;
   filling the expanded portion of the trench with a polysilicon material;
   forming a partition in the polysilicon material to separate the polysilicon in a first portion of the expanded portion of the trench from the polysilicon in a second portion of the expanded portion of the trench.

2. The method of claim 1, wherein the step of forming a trench in the substrate comprises:
   forming a layer of protective material on the surface of the substrate;
   patterning an area on the surface of the protective layer corresponding to a desired location for the opening of the trench, the area having a cross-sectional area approximately equal to the first cross-sectional area;
   removing the patterned area of the protective layer;
   etching the substrate to a first depth through the removed patterned area to form the trench.

3. The method of claim 2, further comprising, after the step of etching the substrate to a first depth, forming a collar on the wall of the trench, and increasing the depth of the trench to a second depth in the substrate.

4. The method of claim 3, wherein the collar is formed of nitride.

5. The method of claim 4, wherein the step of expanding the trench comprises:
   oxidizing the wall of the trench below the collar;
   isotopically etching the oxidized wall.

6. The method of claim 2, wherein the protective layer comprises a first nitride layer on the surface of the substrate, an oxide layer on the first nitride layer and a second nitride layer on the oxide layer.

7. The method of claim 1, wherein the step of filling the expanded portion of the trench comprises repeatedly depositing polysilicon in the trench and etching it back, such that the neck of the trench near the substrate surface is filled toward the end of a final one of the repeated depositions, whereby the trench becomes filled with polysilicon free of voids.

8. The method of claim 1, wherein the dielectric material is an oxide-nitride-oxide composite.

9. The method of claim 1, wherein the step of forming a partition comprises:
   etching the polysilicon material to form a channel therein separating a first remaining portion of the polysilicon material from a second remaining portion of the polysilicon material;
   forming a second dielectric material on the walls defining the channel in the polysilicon material;
   forming a contact region at the bottom of the channel;
   filling the channel with polysilicon, whereby the polysilicon in the channel is in electrical contact with the substrate.

10. The method of claim 9, further comprising forming a cap oxide on top of the partition.

11. The method of claim 10, further comprising forming a pair of straps along the walls of the upper portion of the trench, each of the straps being in electrical contact with a different one of the first and second portions of the expanded portion of the trench.

12. The method of claim 11, further comprising forming a nitride layer on the cap oxide and opposing surfaces of the straps.

13. The method of claim 11, further comprising forming a gate nitride plug on the oxide cap and between the straps.

14. The method of claim 13, further comprising forming a gate poly region above the nitride plug.

15. The method of claim 1, further comprising fabricating a pair of vertical devices proximate the trench opening, each vertical device being coupled to a different one of the first and second portions.

* * * * *